United States Patent [19]

Podszun et al.

[11] Patent Number: 5,395,730
[45] Date of Patent: Mar. 7, 1995

[54] IMAGE FORMATION BY THERMAL TRANSFER

[75] Inventors: Wolfgang Podszun, Cologne, Germany; Herman J. Uytterhoeven, Bonheiden, Belgium; Roland F. Beels, Aartselaar, Belgium; Luc H. Leenders, Herentals, Belgium

[73] Assignee: Agfa-Gevaert, N.V., Mortsel, Belgium

[21] Appl. No.: 114,082

[22] Filed: Aug. 31, 1993

[30] Foreign Application Priority Data

Aug. 31, 1992 [EP] European Pat. Off. ........... 92202632

[51] Int. Cl.$^6$ ................................. G03C 5/54
[52] U.S. Cl. ................................. 430/203; 430/204; 430/254; 430/255
[58] Field of Search ............... 430/254, 255, 253, 203, 430/204

[56] References Cited

U.S. PATENT DOCUMENTS

| | | | |
|---|---|---|---|
| 3,971,660 | 7/1976 | Staehle | 430/204 |
| 4,933,256 | 6/1990 | Kakimi | 430/254 |
| 5,053,312 | 10/1991 | Takeda | 430/254 |
| 5,192,639 | 3/1993 | Hirai | 430/254 |
| 5,254,434 | 10/1993 | Uytterhoeven et al. | 430/203 |

Primary Examiner—Richard L. Schilling
Attorney, Agent, or Firm—Breiner & Breiner

[57] ABSTRACT

A method is disclosed for the formation of an image comprising the steps of
(1) image-wise exposing, in the presence of a photopolymerizable compound, a photosensitive element comprising a support and at least one photosensitive layer containing a silver halide sensitive to actinic radiation, an organic silver salt and a reducing agent,
(2) heating said photosensitive layer while in contact with a receiving element and allowing non-photopolymerized compound in the non-exposed areas to transfer and penetrate in said receiving element, and,
(3) separating said receiving element from said photosensitive element.

The obtained image can be a useful visible image produced on at least one of the separated elements, or it can be a hydrophobic polymer image on a hydrophilic background formed in the finally separated-receiving element which is usable as a printing plate. In the former embodiment the receiving element comprises a support and a layer containing a pigment, e.g. carbon black. In the latter embodiment the receiving element must comprise a hydrophilic surface, e.g. a support coated with a hydrophilic layer, or a metal support having a hydrophilic surface.

The photopolymerizable compound preferably bears one or more functional (meth)acrylate groups. Most preferably this compound is chosen from particular classes of reactive multifunctional monomers.

19 Claims, No Drawings

IMAGE FORMATION BY THERMAL TRANSFER

DESCRIPTION

1. Field of the Invention.

The present invention relates to a method for the formation of an image or the production of a printing plate by means of a thermal transfer system based on photopolymerizable monomers.

2. Background of the Invention.

In recent time dry processes are preferred in imaging technology for ecological reasons and for convenience of the customer. Conventional photographic processing solutions contain ingredients which are suspect from the view point of ecology. The commonly used developing agent hydroquinone shows allergenic effects. The biodegradation of disposed Phenidone is too slow. Sulphite ions show a high COD (Chemical Oxygen Demand) and are transformed into sulphate ions which are harmful for e.g. concrete. In graphic arts some "hard dot Rapid Access" materials contain ecologically harmful hydrazine derivatives which can be partially rinsed out during processing. As a consequence depleted processing should not be discharged into the public sewerage; they have to be collected and destroyed by combustion, a cumbersome and expensive process. So it is no wonder that manufacturers of photographic materials are looking for dry system alternatives.

The use of photopolymerizable compositions for the production of images by information-wise exposure thereof to actinic radiation is well known. Several methods for forming images using photopolymerizable compositions are known. All these methods are based on the principle of introducing a differentiation in properties between the exposed and nonexposed parts of the photopolymerizable composition e.g. a difference in solubility, adhesion, conductivity, refractive index, tackiness, permeability, diffusibility of incorporated substances e.g. dyes etc.. The thus produced differences may be subsequently employed in a developing step to produce a visible image and/or master for printing e.g. a lithographic or electrostatic printing master.

Techniques for forming a polymer image in which an organic dye serves as a photo-sensitizer, initiating the photo-polymerization reaction, are well known in the art, but the sensitivity thereof is in general far inferior compared to the sensitivity of silver halide photographic materials. Several methods have therefore been proposed in which an exposed silver halide, bearing a latent image, is used as a trigger and the high amplification degree thereof in a development step is utilized for initiation of the polymerization reaction.

For instance, Examined Japanese Patent Publications Nos. 46-6581 and 46-16357, Unexamined Japanese Patent Publications Nos. 57-138632, 57-142638, 57-176033, 58-107529, 58-169143 and 58-174947, and U.S. Pat. Nos. 3,707,379, 3,767,400, 3,782,943, 3,697,275, 3,756,818, 3,687,667, 3,874,947, 3,756,820 and 3,746,542 disclose methods in which the polymerization reaction is initiated by a radical derived from a reducing agent which is oxidized during development of silver halide. U.S. Pat. Nos. 3,241,962, 3,345,164 and 3,029,145 describe various methods in which the polymerization reaction is initiated by a radical derived from a peroxide in several different ways.

As to the methods cited it is assumed that a polymer image is formed with a sensitivity similar to that of a conventional silver halide system. However these methods all require a wet treatment for the development of silver halide and the polymerization. As stated above dry processes are preferred for convenience and for ecological reasons. As a consequence various ways were explored in order to use "dry silver systems", not requiring any wet treatment, as photo-initiators for polymerization.

For instance, in U.S. Pat. No. 4,629,676 an image forming method is disclosed comprising exposing a recording material including a light-sensitive silver salt, a reducing agent, a polymerizable compound and a binder, and subsequently subjecting said recording material to a heat treatment in dry conditions, thereby forming a polymeric compound in the exposed areas. Preferably a silver salt oxidizing agent, e.g. silver behenate, is also present. The polymerizable compound can be chosen from a wide variety of chemical classes, e.g. acrylic acid derivatives, vinyl derivatives, styrenes etc. The reducing agent can be chosen from several classes, e.g. phenols, polyphenols, naphthols and hydrazines.

In U.S. Pat. No. 4,859,568 a similar process is described in which arylhydrazines are claimed as especially useful reducing agents.

In a further variant according to EP 0 203 613 a similar material is described containing microcapsules wherein the polymerizable compound and a colour forming substance are together encapsulated.

Finally, in EP 0 219 087 and EP 0 235 751 especially useful classes of hydrazine derivatives serving as reducing agents are claimed in similar materials and processes.

The present invention extends the teachings on photopolymerization, based on dry silver initiation, to new applications based on thermal transfer.

It is an object of the present invention to provide an alternative method requiring no wet treatment for the formation of a black-and-white or colour image.

It is a further object of the present invention to provide an alternative method requiring no wet treatment for the production of a lithographic printing plate.

Other objects of the present invention will become clear from the description and examples hereafter.

SUMMARY OF THE INVENTION.

The objects of the present invention are realized by providing a method for the formation of an image comprising the steps of
(1) image-wise exposing, in the presence of a photopolymerizable compound, a photosensitive element comprising a support and at least one photosensitive layer containing a silver halide sensitive to actinic radiation, an organic silver salt and a reducing agent,
(2) heating said photosensitive layer while in contact with a receiving element and allowing nonphotopolymerized compound in the non-exposed areas to transfer and penetrate in said receiving element, and,
(3) separating said receiving element from said photosensitive element.

The obtained image can be a useful visible image produced on at least one of the separated elements, or a hydrophobic polymer image on a hydrophilic background formed in the finally separated receiving element which is usable as a printing plate.

For the embodiment of formation of a useful visible image the receiving element comprises a support and a layer containing a pigment, e.g. carbon black. By the introduction by the method described of differences of cohesive and adhesive forces between image and non-image parts a useful visible image is obtained in at least one of the separated elements.

For the embodiment of formation of a polymeric image on a hydrophilic background, useful as a printing plate the receiving element must comprise a hydrophilic surface, e.g. a support coated with a hydrophilic layer, or a metal support having a hydrophilic surface. In this embodiment the peeled-off receiving element is subjected to a post-hardening treatment, being an overall UV exposure and or a heating step in order to polymerize and fix the thermally transferred non-photopolymerized compounds in the non-image areas.

The photopolymerizable compound preferably bears one or more functional (meth)acrylate groups. Most preferably this compound is chosen from particular classes of reactive multifunctional monomers (see detailed description). The photopolymerizable compound can be present in the photosensitive layer, or in an extra layer coated on top of the photosensitive element, or in an extra layer coated on top of the receiving element.

The photosensitive element and the receiving element are brought in contact preferably by a lamination step. The exposure of the photosensitive element can be performed before or after being brought in contact with the receiving element. If needed in the latter case the exposure can be performed through the back of the photosensitive element.

DETAILED DESCRIPTION OF THE INVENTION

A wide variety of photopolymerizable compounds can be used in the present invention, e.g. the monomers disclosed in DE-OS Nos. 4,005,231, 3,516,256, 3,516,257, 3,632,657 and U.S. Pat. No. 4,629,676, unsaturated esters of polyols, particularly such esters of the alpha-methylene carboxylic acids, e.g. ethylene diacrylate, glycerol tri(meth)acrylate, ethylene dimethacrylate, 1,3-propanediol di(meth)acrylate 1,2,4-butanetriol tri(meth)acrylate, 1,4-cyclohexanediol di(meth)acrylate, 1,4-benzenediol di(meth)acrylate, pentaerythritol tetra(meth)acrylate, dipentaerythrolpentacrylate, 1,5-pentanediol di(meth)acrylate, the bis acrylates and methacrylates of polyethylene glycols of molecular weight 200–500, and the like: unsaturated amides, particularly those of the alphamethylene carboxylic acids, and especially those of alpha-omega-diamines and oxygen-interrupted omega-diamines, such as methylene bis-acrylamide, methylene bis-methacrylamide, 1,6-hexamethylene bis-acrylamide, diethylene triamine tris-methacrylamide, bis(gamma-methacrylamidopropoxy)ethane, beta-methacrylamidoethyl methacrylate, N-(beta-hydroxyethyl)-beta-(methacrylamido)ethyl acrylate and N,N-bis(beta-methacrylolyoxyethyl)acrylamide; vinyl esters e.g. divinyl succinate, divinyl adipate, divinyl phthalate, divinyl butane-1,4-disulfonate; and unsaturated aldehydes, e.g. sorbaldehyde (hexadienal). The photopolymerizable composition may also comprise polymers and/or oligomers comprising 2 or more polymerizable functions e.g. acrylated epoxys, polyester acrylates, urethane acrylates etc.. It will be clear that these monomers and/or polymers and/or oligomers can be used in admixture.

It is also possible to use monofunctional (meth)acrylic acid esters as monomer provided they are not to volatile and do not spread an unwanted odour. Suitable compounds include n-octylacrylate, n-octylmethacrylate, decylacrylate, decylmethacrylate, stearylacrylate, stearylmethacrylate, cyclohexylacrylate, cyclohexylmethacrylate, phenylethylacrylate, phenylethylmethacrylate.

Further useful monomers include hydrophilic monomers showing a good dispersibility in water, e.g. sulphoethylmethacrylate, acrylamidomethylsulphonic acid, hydroxyethylmethacrylate and ethyleneoxide containing monomers like tetraethyleneglycolmono(meth)acrylate.

The most preferred polymerizable compounds comprise one or more (meth)acrylate functional groups.

Particular preferred classes of photopolymerizable compounds containing (a) (meth)acrylate group(s) are reactive multifunctional monomers represented by general formula (I) or (II):

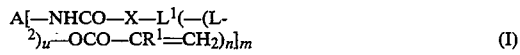

(I)

wherein n represents an integer from 1 to 3, m equals an integer of 3 to 6 when n equals 1, and 2 to 6 when n equals 2 or 3, and u equals 0 or 1; A represents an organic group of the following nature being 3 to 6 valent when n equals 1 and being 2 to 6 valent when n equals 2 or 3:

a) a hydrocarbon residue containing 5 to 25 carbon atoms which may be interrupted by one or more ether, ester or amide functions;

b)

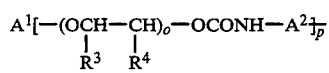

with $A^1$ representing a linear or branched aliphatic residue that may contain 0 to 3 O-atoms and 2 to 20 C-atoms, an aromatic residue containing 6 to 24 carbon atoms, an aromatic aliphatic residue containing 7 to 28 C-atoms or an cycloaliphatic residue containing 6 to 26 C-atoms, $R^3$ and $R^4$ each independently representing a hydrogen or a methyl group, $A^2$ representing a hydrocarbon residue containing 5 to 25 carbon atoms, o represents an integer of 0 to 5 and p represents an integer of 2 to 6 when n equals 2 or 3 and represents an integer of 3 to 6 when n equals 1;

c)

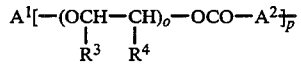

wherein $A^1$, $A^2$, $R^3$, $R^4$, o and p have the same meaning as defined above d)

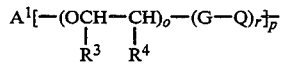

wherein $A^1$, $A^2$, $R^3$, $R^4$, o and p have the same meaning as defined above;

G represents —O—CO—NH—Y(—COO—)$_q$—;

wherein Y represents a divalent (cyclo)aliphatic residue containing 2 to 15 C-atoms and that may contain an ester, ether or urethane function, and q represents 0 or 1

Q represents a linear or branched aliphatic hydrocarbon residue containing 3 to 15 carbon atoms and which may comprise 1 to 3 oxygen bridges and r equals 0 or 1, X represents O or $NR^2$, $L^1$ represents an aliphatic hydrocarbon residue that is at least divalent and that may comprise 1 to 3 O-atoms, $L^2$ represents a lower alkylene of 1 to 6 C-atoms which may be branched or linear, $R^1$ represents hydrogen or a methyl group, $R^2$ represents hydrogen or a lower alkyl group of 1 to 6 C-atoms;

$$Ur[-R^7-NHCO-Z-R^8(-OCO-\underset{R^9}{C}=CH_2)_\alpha]_\beta \quad (II)$$

wherein Ur represents a divalent or trivalent condensed urea residue; Z represents O or $NR^{10}$ with $R^{10}$ representing alkyl containing 1 to 12 C-atoms; $R^7$ represents a divalent hydrocarbon residue containing 2 to 25 C-atoms; $R^8$ represents a hydrocarbon residue with a valence between 2 and 6, and containing 2 to 18 C-atoms, which can be linear or branched and which can be interrupted by up to 3 O atoms; $R^9$ represents hydrogen or methyl; $\alpha$ represents an integer from 1 to 5, and $\beta$ equals 2 or 3.

Preferably used monomers according to general formula (I) comprise one of the following residues as hydrocarbon residue A and/or $A^2$ in this general formula (I):

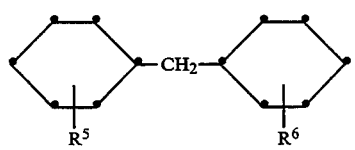

Ia $-(CH_2)_s-CH-(CH_2)_t-$    Ib

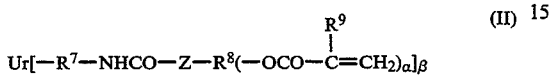

Ic

Id wherein $R^5$ and $R^6$ each independently represent hydrogen or a lower alkyl of 1 to 6 C-atoms, s and t independently represent an integer from 1 to 6 and wherein the aliphatic hydrocarbon residues Ia, Ic and Id comprise 2 to 6 free valences.

Examples of monomers according to formula (I) suitable for use in accordance with the present invention are shown in table 1.

TABLE 1

| | |
|---|---|
| $CH_3-CH_2-C[CH_2O-(CH_2CH(CH_3)-O-)_{2.4}-CO-(CH_2)_5-NHCOO-CH_2-CH_2-O-CO-C(CH_3)=CH_2]_3$ | 1 |
| $CH_3-CH_2-C[CH_2O-(CH_2CH(CH_3)-O-)_{2.4}-CO-(CH_2)_5-NHCOO-CH-(CH_2-O-CO-C(CH_3)=CH_2)_2]_3$ | 2 |
| $C[CH_2O-CO-(CH_2)_5-NH-COO-CH_2-CH_2-OCO-CH=CH_2]_4$ | 3 |
| $C[CH_2O-CO-(CH_2)_5-NH-COO-CH_2-CH_2-OCO-C(CH_3)=CH_2]_4$ | 4 |
| $[(CH_2=C(CH_3)-COO-CH_2)_2-CH-OOCNH-(CH_2)_5-COO-CH_2]_2$ $\searrow$ C $\nearrow$ $[CH_2=C(CH_3)-COO-CH_2-CH_2-OOCNH-(CH_2)_5-COO-CH_2]_2$ | 5 |
| $[(CH_2=C(CH_3)-COO-CH_2)_2-CH-OOCNH-(CH_2)_5-COO-CH_2]_i$ $\searrow$ C $\nearrow$ $[CH_2=C(CH_3)-COO-CH_2-CH_2-OOCNH-(CH_2)_5-COO-CH_2]_j$ | 6 | i and j are respectively 3.5 and 0.5 indicating that compound 6 is a mixture of compounds obtained by reacting i equivalents of glycerine-dimethacrylate and j equivalents of hydroxyethyl methacrylate as disclosed in DE 3,703,130.

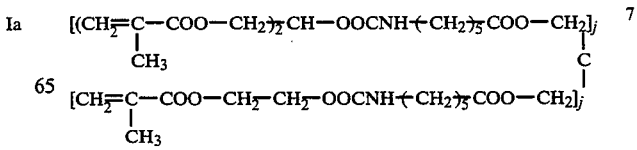

7 i and j are respectively 2.5 and 1.5 indicating that compound 7 is a mixture of compounds obtained by reacting i equivalents of glycerine-dimethacrylate and j equivalents of hydroxyethyl methacrylate as disclosed in DE 3,703,130.
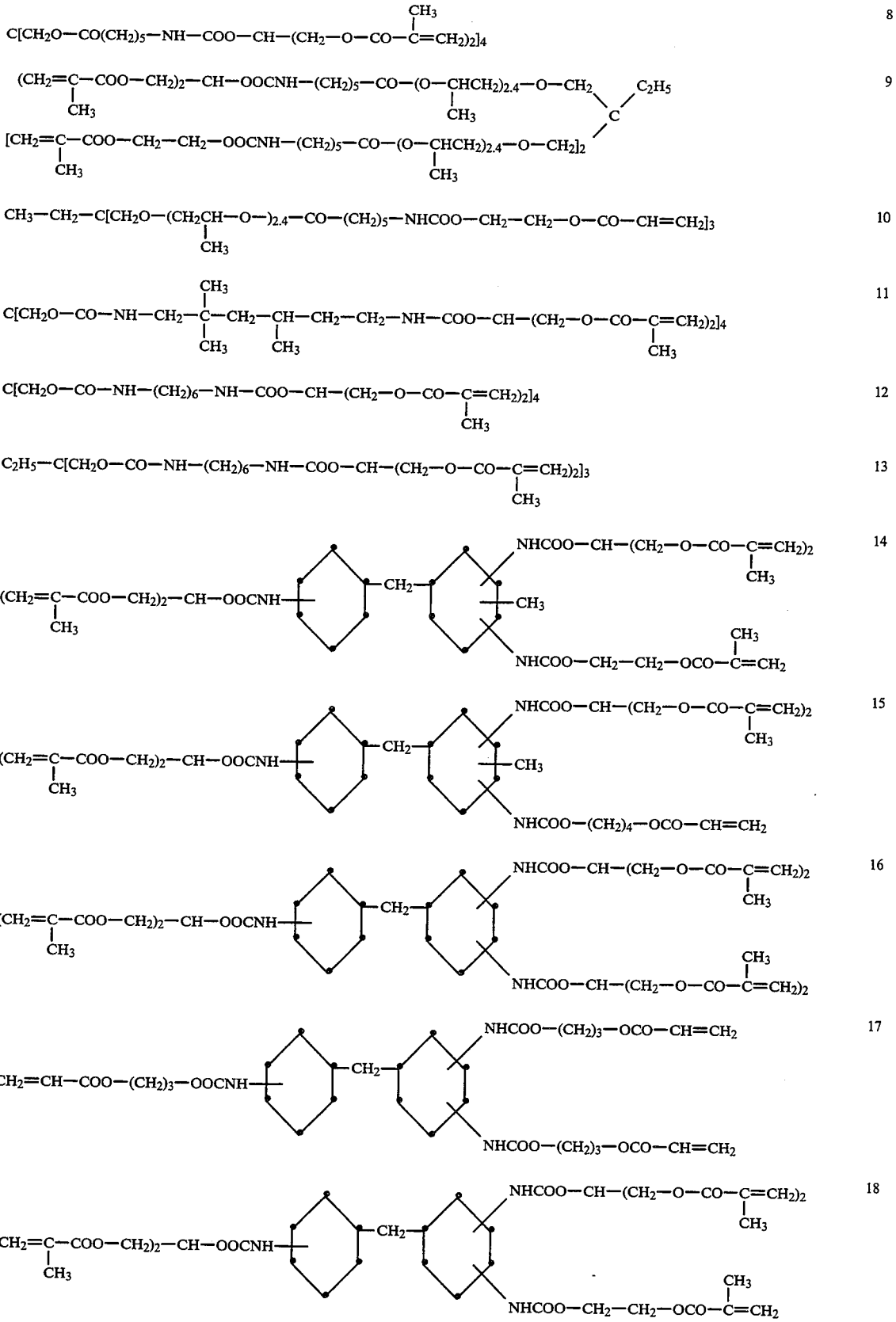

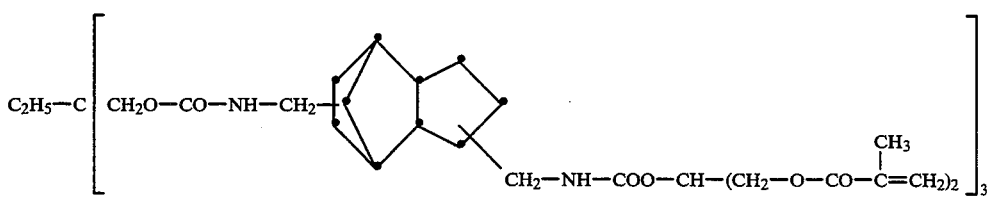

19

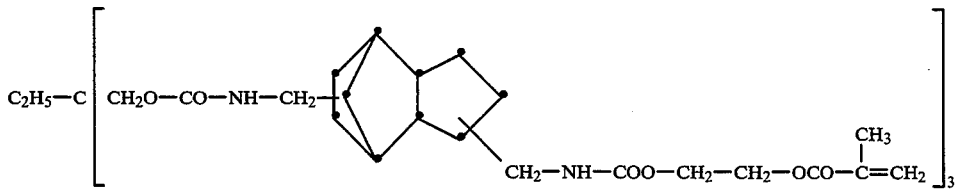

20

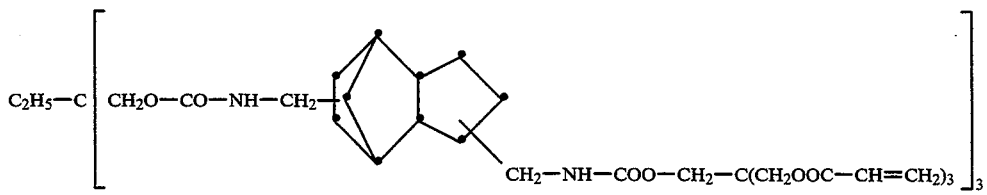

21

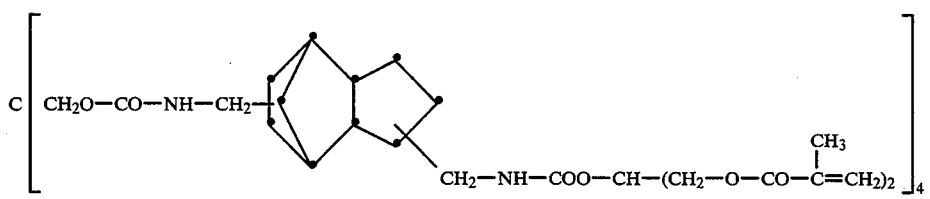

22

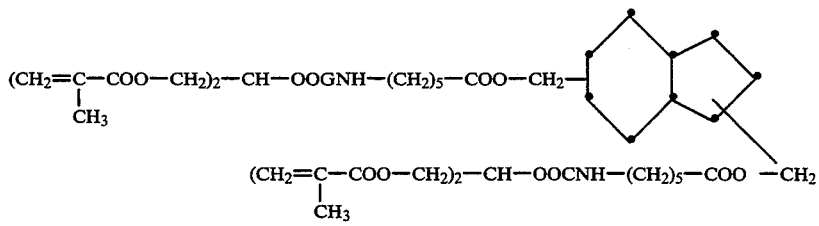

23

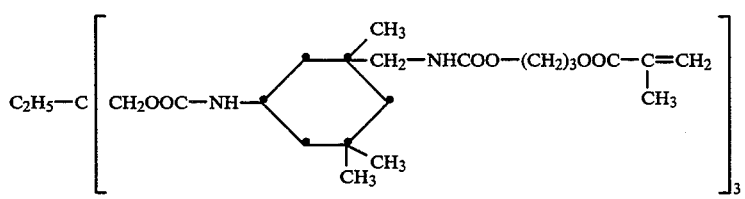

24

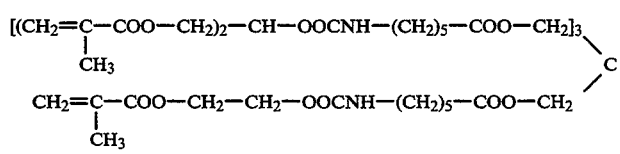

25

The fractal indexes in the formulas 1, 2 and 10 indicate that these formulas represent a mixture of compounds having a different length of the ethylene-oxide piece in said formulas the indexes thus representing an average of said ethylene-oxide piece. The formulas 14 to 23 represent a mixture of structural isomers and can be used in accordance with the present invention without separation of the isomers.

It has been found that the monomers corresponding to general formula (I) show a high polymerization rate and solidify even at conversions as low as 10% thus allowing a rapid differentiation between exposed and non-exposed parts.

The monomers corresponding to general formula (I) are known and can be prepared according to the German patent application numbers 3,522,005, 3,703,080, 3,643,216, 3,703,130, 3,917,320 and 3,743,728.

In general monomer formula (II) preferred condensed urea residues represented by Ur are following structural units:

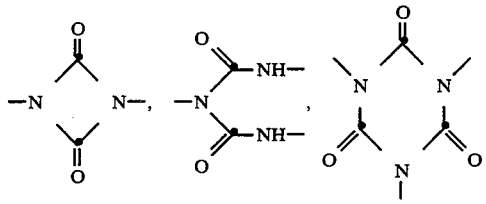

Preferably the divalent residue represented by Z is an oxygen atom. In the case Z represents $NR^{10}$, then $R^{10}$ is preferably a linear or branched alkyl group, e.g. methyl, ethyl, propyl or t.butyl.

The hydrocarbon residue represented by $R^7$ may be interrupted by oxygen. $R^7$ represents aliphatic, aromatic or mixed aliphatic-aromatic hydrocarbon residues. For example, $R^7$ equals a divalent linear or branched aliphatic group, preferably having 2 to 12 carbon atoms, e.g. ethylene, propylene, 1,4-tetramethylene, 1,6-hexamethylene and 2,2,4-trimethyl-1,6-hexamethylene and their isomers. Alternatively $R^7$ may represent a monocyclic or polycyclic saturated or aromatic hydrocarbon residue having 6 to 24, and preferably 6 to 14 carbon atoms.

Examples of preferred useful monomers according to general formula (II) a relisted below in table 2:

TABLE 2

II-1

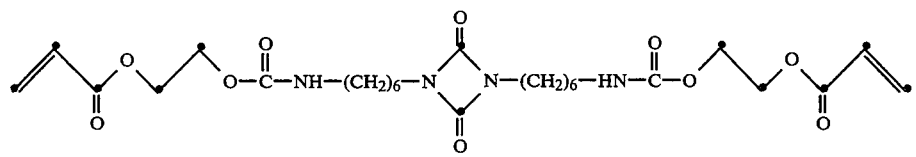

II-2

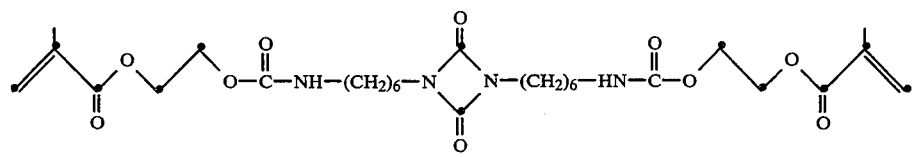

II-3

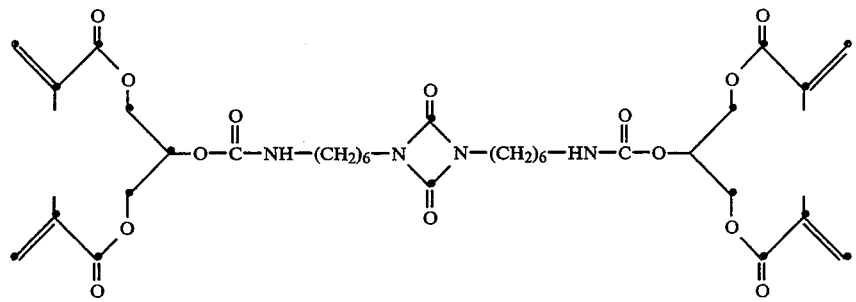

II-4

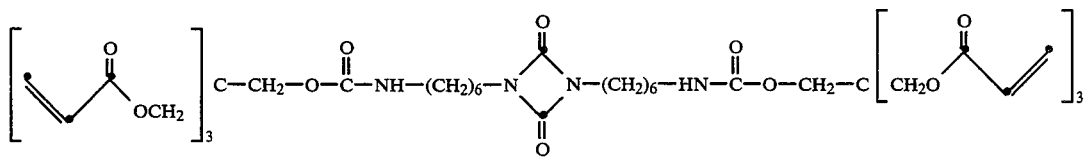

II-5

TABLE 2-continued

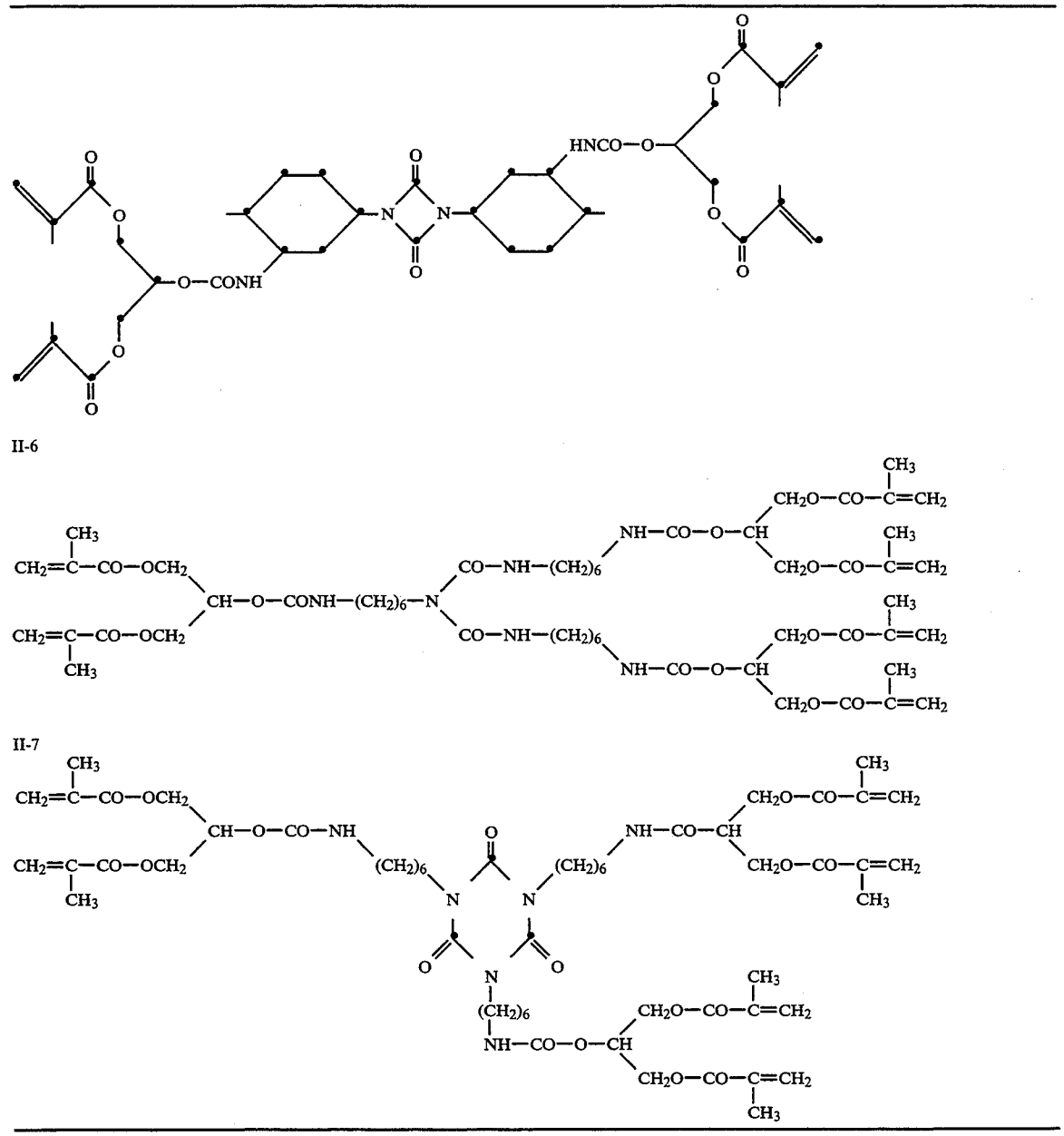

One monomer or a mixture of more than one monomer can be used.

The photopolymerizable compound(s) can be present in the same photosensitive layer where the silver halide is incorporated, or alternatively it (they) can be present in a separate layer, e.g. a layer coated on top of the photosensitive layer, or a layer coated on top of the receiving element.

The layer containing the photopolymerizable compound preferably also comprises at least one photoinitiator. Preferably used photoinitiators are polymerization initiators activatable by actinic light and thermally inactive at and below 185° C. Examples of such initiators include the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Such initiators include 9-10-anthraquinone, 1-chloroanthraquinone, 2-chloroanthraquinone, 2-methylanthraquinone, 2-tert-butylanthraquinone, octamethylanthraquinone, 1,4-naphtoquinone, 9,10-phenanthrenequinone, 1-2 benzanthraquinone, 2,3-dichloronaphthoquinone, sodium salt of anthraquinone alpha-sulfonic acid, 3-chloro-2-methylanthraquinone, and 1,2,3,4-tetrahydrobenzene a anthracene-7,12-dione. The photointiators which are also useful are described in Plambeck U.S. Pat. No. 2,760,863 and include vicinal ketaldonyl compounds, such as diacetyl, benzil, etc. alpha-ketaldonyl alcohols, such as benzoin, pivalon, etc. acyloin ethers e.g. benzoin methyl and ethyl ethers, etc.; alpha-hydrocarbon substituted aromatic acyloins, including methylbenzoin, alpha-allylbenzoin, and alpha-phenylbenzoin. Still further photoinitiators useful in accordance with the present invention are those disclosed in "Photoreactive Polymers" by Arnost Reiser, "Organic photochemical imaging systems" by G. A. Delzenne, in the paper "UV-Curing Chemistry: Past, Present, and Future" by Christian Decker, published in J. of Coatings Technology, Vol. 59, No. 751, August 1987, pages 97–106, in EP-A 362,827, and in U.S. Pat. No. 3,558,309.

The weight ratio of photoinitiator to the polymerizable compound(s) in the photopolymerizable composition is preferably between 1:1 and 1:10.

The layer containing the photopolymerizable compound can further contain thermal polymerisation inhibitors. Inhibitors for use in accordance with the present invention are p-methoxyphenol, hydroquinone, alkyl and acyl-substituted hydroquinones and quinones, tert-butylcatechol, pyrogallol, copper resinate, naphtylamines, beta-naphthol, cuprous chloride, 2,6-di-tert-butyl p-cresol, photothiazine, pyridine, nitrobenzene and dinitrobenzene, p-toluquinone and chloranil.

Apart from the possible presence of the photopolymerizable compound the photosensitive layer contains a silver halide sensitive to actinic radiation, an organic silver salt oxidizing agent and a reducing agent.

The halide composition of the silver halide emulsions which can be used in the present invention is not specifically limited and may be any composition selected from i.a. silver chloride, silver bromide, silver iodide, silver chlorobromide, silver bromoiodide, and silver chlorobromoiodide. However for reasons of sensitivity silver (iodo)bromide emulsions are preferred. The content of silver iodide is equal to or less than 20 mol %.

The photographic emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The light-sensitive silver halide emulsion can be a so-called primitive emulsion, in other words an emulsion that has not been chemically sensitized. However, the light-sensitive silver halide emulsion can be chemically sensitized as described i.a. in the above-mentioned "Chimie et Physique Photographique" by P. Glafkides, in the above-mentioned "Photographic Emulsion Chemistry" by G. F. Duffin, in the above-mentioned "Making and Coating Photographic Emulsion" by V. L. Zelikman et al, and in "Die Grundlagen der Photographischen Prozesse mit Silberhalogeniden" edited by H. Frieser and published by Akademische Verlagsgesellschaft (1968).

The light-sensitive silver halide emulsions can be spectrally sensitized with methine dyes such as those described by F. M. Hamer in "The Cyanine Dyes and Related Compounds", 1964, John Wiley & Sons. Dyes that can be used for the purpose of spectral sensitization include cyanine dyes, merocyanine dyes, complex cyanine dyes, complex merocyanine dyes, hemicyanine dyes, styryl dyes and hemioxonol dyes. Particularly valuable dyes are those belonging to the cyanine dyes, merocyanine dyes and complex merocyanine dyes. However in a preferred embodiment of the present invention the silver halide is not spectrally sensitized.

Alternatively the silver halide is not incorporated into the photosensitive layer as an emulsion but is generated in situ in the photosensitive composition by reaction of the silver salt oxidizing agent, e.g. silver behenate, and a halide providing salt, e.g. a lithium halide.

The photosensitive layer further comprises an organic silver salt oxidizing agent for the purpose of oxidizing the reducing agent in the image parts. These silver salts are themselves relatively stable to light, but when heated in the presence of a silver halide bearing a latent image, oxidize the reducing agent while being themselves reduced to silver. Examples of such silver salts are silver salts of a fatty acid (e.g. behenic acid, stearic acid, lauric acid, maleic acid, adipic acid, etc.), an aromatic carboxylic acid (e.g. benzoic acid, phtalic acid, terephtalic acid, salicylic acid, etc.), a mercapto group- or thione group-containing compound (e.g., 3-mercapto-4-phenyl-1,2,4-triazole, 2-mercaptobenzimidazole, etc.) or an imino group-containing compound (e.g. benzotriazole or derivatives thereof as described in GB 1,173,426 and U.S. Pat. No. 3,635,719, etc.). In a most preferred embodiment of the present invention the silver salt oxidizing agent is silver behenate.

Useful reducing agents include resorcins, m-aminophenols, alkylphenols, alkoxynaphtols, m-phenylenediamines. A preferred class of reducing agents is constituted by hydrazine compounds. Especially preferred hydrazine compounds include p-tolylhydrazine hydrochloride, N,N-phenylformylhydrazide, acetohydrazide, benzoylhydrazide, p-toluenesulphonylhydrazide, N,N'-diacetylhydrazine, $\beta$-acetylphenylhydrazine, etc.

The reducing agents may be used in combination if desired.

Although the photopolymerizable compound itself can function as a binder preferably an extra binder is present in the layer(s) of the recording material of the present invention. Examples of useful binders include organic solvent-soluble polymers, e.g. polymethyl methacrylate, polyvinyl chloride, a vinylidene chloride-vinyl chloride copolymer, polyvinyl acetate, a vinyl acetate-vinyl chloride copolymer, a vinylidene chloride-acrylonitrile copolymer, a styrene-acrylonitrile copolymer, a polyester, a polyamide, chlorinated polyethylene, chlorinated polypropylene, etc. An especially preferred binder is polyvinylbutyral (sold under the trade name BUTVAR by MONSANTO Co). Several organic solvents can be used for dissolving and coating these polymers. These polymer binders may be used either alone or in combination of two or more thereof. Also they can be combined with water-soluble binders, e.g. gelatin, polyvinyl alcohol, polyvinyl pyrrolidone, carboxymethyl cellulose, gum arabic, casein, methyl cellulose, etc. For example, a silver halide is prepared in the form of a gelatinous emulsion, which may be added to a coating solution comprising a binder other than gelatin and a monomer. In this case two or more kinds of binder are not necessarily mixed uniformly. Further the monomer is not necessarily mixed uniformly with the binder.

The preferred concentration ranges of the essential ingredients of the photosensitive coating composition are represented in table 3, expressed as their respective weight percentages in that coating composition:

TABLE 3

| ingredient | weight % range | preferred weight % range |
|---|---|---|
| (a) photopolymerizable compound present in photosensitive layer; | | |
| silver halide | 1–20 | 2–10 |
| silver salt oxidizing ag. | 5–50 | 8–40 |
| reducing agent | 0.5–25 | 1–15 |

TABLE 3-continued

| ingredient | weight % range | preferred weight % range |
|---|---|---|
| binder | 0–50 | 5–20 |
| monomer | 5–70 | 10–40 |
| (b) photopolymerizable compound present in separate layer; | | |
| silver halide | 1–30 | 2–15 |
| silver salt oxidizing ag. | 5–60 | 10–40 |
| reducing agent | 2–30 | 5–20 |
| binder | 10–60 | 15–40 |

The total dry thickness of the photosensitive element can vary between 0.3 and 25 micron.

In the case of separate layers the ratio of the dry thickness of the silver halide layer to the monomer layer can vary from 10:1 to 1:5.

One or more of the layers of the photosensitive element can further contain a thermoplastic polymer. Suitable thermoplastic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosci ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Poly(meth)acrylate and alpha-alkyl poly(meth)acrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alcohol;

(M) Polyvinyl acetal, e.g. polyvinyl butyral, polyvinyl formal;

(N) Polyformaldehydes;

(O) Polyurethanes and copolymers;

(P) Polycarbonate and copolymers;

(Q) Polystyrenes and copolymers e.g. polystyrene/acrylonitrile, polystyrene/acrylonitrile/butadiene.

One or more of the layers of the photosensitive element can further contain non-thermoplastic polymeric compounds to give certain desirable characteristics, e.g. wear properties, chemical inertness, etc. Suitable non-thermoplastic polymeric compounds include polyvinyl alcohol, polyvinyl pyrrolidone, cellulose, anhydrous gelatin, phenolic resins and melamine-formaldehyde resins, etc. If desired, the thermoplastic layer can also contain immiscible polymeric or non-polymeric organic or inorganic fillers or reinforcing agents which are essentially transparent at the wave-lengths used for the exposure of the photopolymeric material, e.g. the organophilic silicas, bentonites, silica, powdered glass, colloidal carbon, as well as various types of dyes and pigments in amounts varying with the desired properties of the thermoplastic layer. These fillers are useful in improving the strength of the composition, reducing tack and in addition, as coloring agents.

Agents to improve the wetting and/or adjust the adhesion of the thermoplastic layer may be added. Suitable agents are e.g. silicones, silicon containing polymers e.g. a poly(dimethylsiloxane)-polyether copolymer, poly(dimethylsiloxane)-polyester, silicon containing surfactants, fluor containing copolymers and fluor containing surfactants etc..

Various dyes, thermographic compounds, UV-absorbers, anti-oxidants and color forming components can be added to the photosesitive element to give a variety of results after the thermal transfer. These additive materials, however, preferably should not absorb excessive amounts of light at the exposure wavelength or inhibit the polymerization reaction.

The support of the photosensitive element of the present invention is preferably a transparent organic resin support e.g. cellulose nitrate film, cellulose acetate film, polyvinyl acetal film, polystyrene film, polyethylene terephthalate film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a subbing layer.

According to the particular embodiment the receiving element in connection with the present invention comprises a support and a pigmented layer, or a support having a hydrophilic surface. In the embodiment where finally a useful visible image must be obtained the receiving element comprises a support and a receiving layer containing a pigment. Suitable pigments are e.g. carbon black, $TiO_2$, $SiO_2$, phthalocyanine pigments and other dye pigments, graphite, phosphor particles, ceramics, clays, metal powder such as aluminium, copper, magnetic iron and bronze, etc. or mixtures thereof. A preferred pigment is carbon black. In the latter embodiment a useful black-and white image can eventually be obtained in the separated receiving element and/or in the separated photosensitive element. A system based on this method constitutes an alternative to a conventional image-setting film or a conventional duplicating film. In another preferred embodiment the pigment is a dye pigment. The coloured image finally obtained can serve as a so-called single colour proof of an original or of a colour separation of an original produced by a scanner.

In the embodiment of the present invention in which finally a printing plate has to be obtained, the receiving element must comprise a support with a hydrophilic surface or coated with a hydrophilic layer. Receiving materials are e.g. polyester film supports, metal supports like Al or Zn, and paper bases. These supports, if not sufficient hydrophilic by themselves, are first coated with a hydrophilic layer. A particularly suitable receiving element comprises a polyester base coated with a layer of polyvinyl alcohol hardened with a tetraalkyl orthosilicate e.g. tetramethylorthosilicate or tetraethylorthosilicate and containing $TiO_2$, as disclosed in e.g. U.S. Pat. No. 3,971,660.

A preferably used metal support is aluminium. Suitable aluminium supports for use in accordance with the present invention are aluminium foils made of pure aluminium or of an aluminium alloy, the aluminium content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the foil usually ranges from about 0.13 to about 0.50 mm.

The preparation of aluminium or aluminium alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results.

Graining of the aluminium surface can be carried out mechanically or electrolytically in any known way. The roughness produced by the graining is measured as a centre line average value expressed in $\mu m$ and preferably varies from about 0.2 to about 1.5 $\mu m$.

The anodization of the aluminium foil can be performed in electrolytes e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.0 $\mu m$. To promote the image sharpness and, as a consequence thereof, the sharpness of the final printed copy, the anodization layer may be coloured in the mass with an antihalation dye or pigment e.g. as described in JA-A 58-14797. The dye or pigment or a combination of dyes or pigments used for such colouring in the mass are chosen such that they prevent or reduce halation in the layer comprising the polymer containing aryldiazosulfonates.

After the anodizing step the anodic surface may be sealed. Sealing of the pores of the aluminium oxide layer formed by anodization is a technique known to those skilled in the art of aluminium anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminium surface exist. An advantageous sealing method is the hydration-sealing method, according to which the pores are closed or partially closed through water-acceptance so that hydrated needle-like aluminium oxide crystals (böhmite) are formed. The anodic surface of the aluminium foil can thus be rinsed with water at 70°–100° C. or with steam. The hot sealing water may comprise additives e.g. nickel salts to improve the sealing effect. The sealing can also be performed by treatment of the anodic surface with an aqueous solution comprising phosphate ions or silicates. Thanks to the sealing treatment the anodic layer is rendered substantially non-porous so that longer press runs can be made with the printing plate obtained. As a result of the sealing the occurrence of fog in the non-printing areas of the printing plate is avoided substantially.

The graining, anodizing, and sealing of the aluminium foil can be performed as described in e.g. U. S. Pat No. 3,861,917 and in the documents referred to therein.

The photosensitive element and the receiving element are preferably brought in contact by lamination, preferably by conveying them together through a roller laminator. If necessary heat can be applied to the rollers.

Exposure can be performed, according to the particular composition and application, by a radiation source emitting a radiation to which the photosensitive element is sensitive, e.g. ultra-violet rays, infra-red rays or visible light. Suitable sources include a tungsten lamp, a fluorescent lamp, a metal halogen lamp, a xenon light, a laser, a light-emitting diode (LED), a cathode ray tube (CRT), etc. Image-wise exposure can also be effected by using X-rays or electron beams. The exposure varies depending on the sensitivity of the silver halide used but, in general, ranges from $10^2$ to $10^5$ $mJ/m^2$.

The image-wise exposure step can be applied to the photosensitive element before the receiving element is brought in contact with it. Alternatively the two elements are brought in contact with each other first and then the image-wise exposure is performed, if necessary through the support of the photosensitive element, in which case of course this support must be transparent. In case of the embodiment in which the layer containing the photopolymerizable compound is a separate layer coated on top of the photosensitive layer it is even possible that the photosensitive layer is exposed before this layer containing the photopolymerizable compound is applied to it.

A subsequent heating step is necessary for promoting the polymerization reaction in the image parts and the thermal transfer of non-polymerized monomers to the receiving element in the non-image parts. Heating can be carried out by the use of a hot plate, a heat roller, an infra-red lamp, a high frequency induction heating device, etc.. The heating temperature is preferably in the range of 70° C. to 180° C., and most preferably in the range of 90° C. to 120° C. The heating time is preferably within the range of 1 second to 5 minutes, and most preferably between 5 seconds and 2 minutes. Optimal heating time and heating temperature are dependent from each other.

Finally the receiving element and the photosensitive element are separated by a peeling-off procedure. According to the particular embodiment a directly usable visible image is obtained, or an image consisting of hydrophobic polymerized areas on a hydrophilic background is obtained in the receiving element, which is usable as a lithographic printing plate.

It may be advantageous to post-harden the transferred image by an overall exposure to UV light and/or a heating step in order to assure the stability of the transferred image. Such a procedure is especially preferably when the transferred image is used as a printing master as described above.

The following examples illustrate the present invention without however limiting it thereto.

EXAMPLES

Example 1

A receiving element comprising a support and a pigmented layer was prepared as follows. On a polyethylene terephtal ate support having a thickness of 0.1 mm were coated (a) a carbon black layer (1.5 g/m$^2$) prepared as a dispersion containing 3.30% of carbon black (trade name PRINTEX U, sold by DEGUSSA Co), 0.67% of polyvinylpyrrolidone (trade name LUVISKOL K90 sold by BASF AG) and 0.50% of wetting agent Ultravon W, and (b) an aqueous gelatinous layer at 0.1 g/m$^2$.

A photosensitive coating composition was prepared wherein silver bromide was generated by in situ reaction of silver behenate and lithium bromide. The resulting composition contained 1.27% of BUTVAR B-79 (sold by MONSANTO Co), 0.41% of palmitic acid/sodium palmitate, 0.85% of lithium behenate, 0.46% of silver bromide, 4.42% of silver behenate, 1.11% of benzoylhydrazide, 4.71% of monomer II-7, 52.51% of methylethylketone and 34.26% of ethanol. This mixture was coated on another polyethylene terephtalate support having a thickness of 0.1 mm at a coverage of 6 g/m$^2$. The resulting photosensitive element was dried on the air for 10 minutes at 40° C.

The receiving element comprising the pigmented layer, and the photo-sensitive layer were conveyed together through a roller laminator, the coated sides being in face to face contact. Then this composite recording material was exposed through the support of the photosensitive element in a contact apparatus by means of UV radiation through a screen test pattern corresponding to a screen ruling of 150 lines/inch. Further on the composite recording material was heated during 30 seconds at 100° C. Finally the layers were separated from each other. A carbon image with excellent sharpness and high optical density was obtained.

Example 2

The previous example was repeated with the exception that the photosensitive element was image-wise exposed before the receiving element and the photosensitive element were conveyed together through the roller laminator. An equally good carbon image was obtained.

Example 3

A receiving element comprising a carbon black layer was prepared as in the previous examples 1 and 2.

A photosensitve element was prepared as follows. An ethanolic coating composition was prepared wherein silver bromide was generated in situ by reaction of sodium behenate and lithium bromide. The resulting composition contained 4.14% of silver behenate, 3.70% of BUTVAR B-79, 0.43% of silver bromide, 1.04% of N,N'-acetyl-phenyl-hydrazine, 0.79% of lithium behenate and 0.39% of palmitic acid/sodium palmitate. This ethanolic solution was coated on a polyethylene terephtalate support having a thickness of 175 micron at a coverage of 4 g/m$^2$. After drying at 40° C. a monomer layer was coated on top of this photo-sensitive layer containing monomer 11 at a coverage of 10 g/m$^2$.

The receiving element and the photo-sensitive element were conveyed together through a roller laminator, the coated sides being in face to face contact. Then this composite recording material was exposed through the base of the photosensitive element in a contact apparatus by means of UV radiation through a screen test pattern corresponding to a screen ruling of 150 lines/inch. Further on the composite recording material was heated during 1.5 minutes at 100° C. Finally the layers were separated from each other. A carbon image with excellent sharpness and high optical density was obtained.

Example 4

The previous example 3 was repeated with the exception that in the photo-sensitive composition the 1.04% of N,N'-acetyl-phenyl-hydrazine was replaced by a mixture of 0.52% of N,N'-acetyl-phenyl-hydrazine and 0.26% of m-dimethylaminophenol, and with the further exception that compound 11 was replaced by compound II-6 in the monomer layer.

Similar good results were obtained.

Example 5

A pigmented receiving element was prepared as in the previous examples 1–4.

A photosensitive element was prepared as follows. A photosensitive layer was prepared with the same composition as in example 3. After drying at 40° C. on air this photosensitive layer was exposed in a contact apparatus with UV radiation through a screen test pattern having a screen ruling of 150 lines/inch. Then on top of it a layer containing dipentaerythrolpentacrylate monomer was applied at a coverage of 10 g/m$^2$.

The receiving element and the photosensitive element were conveyed together through a roller laminator, the coated sides facing each other. Subsequently this composite material was heated at 100° C. and finally the two elements were separated from each other. A carbon black image was obtained with excellent definition.

Example 6

This example was identical to Example 5 with the exception that the image-wise exposure was performed after applying the layer containing the dipentaerythrolpentacrylate monomer to the photosensitive layer. An equally good carbon black image was obtained.

Example 7

This example was identical to Example 5 with the exception that the image-wise exposure was performed through the polyethylene terephtalate support of the photosensitive element after the lamination step. An equally good carbon black image was obtained.

Example 8

A receiving element comprising a hydrophilic layer was prepared as follows. To 418 g of a dispersion in deionized water of 21.5% of titaniumdioxide (mean particle size between 0.3 and 0.5 micron) and 2.5% of polyvinylalcohol were added whilst stirring 220 g of a 5% solution of polyvinylalcohol in water, 95 g of a hydrolysed 22% emulsion of tetramethylorthosilicate in water, and 22 g of a 10% solution of a conventional surfactant. To this mixture were further added 245 ml of deionized water and the pH was adjusted to 4.0. This dispersion was coated on a polyethylene terephtalate support provided with a hydrophilic subbing layer so as to obtain a wet coverage of 55 g/m$^2$. Subsequentially the layer was dried at 30° C. On top of this hydrophilic layer a layer containing the monomer dipentaerythritol pentacrylate was coated at a coverage of 10 g/m².

A photosensitive element was prepared as follows. Onto a subbed polyethylene terphtalate support having a thickness of 175 micron a photosensitive layer was coated at a wet coverage of 4 g/m² from an ethanolic solution containing, after in situ reaction of sodium behenate and lithium bromide, 4.14% of silver behenate, 3.70% of Butvar B-79, 0.43% of silver bromide, 1.04% of N,N'-acetyl-phenylhydrazine, 0.79% of lithium behenate and 0.39% of palmitinic acid/sodium palmitate. The resulting element was dried at 40° C. on air and then exposed in a contact apparatus with UV radiation through a screen test pattern having a screen ruling of 150 lines/inch.

The receiving element containing the hydrophilic layer and the monomer layer, and the photosensitive element were conveyed together through a roller laminator, the coated sides facing each other. Then this composite material was heated at 100° C. during 90 seconds. Subsequently the two elements were separated from each other. The separated receiving element was subjected to a post-hardening treatment by an over-all UV exposure and heating in vacuo at 100° C. A printing plate with excellent printing characteristics was obtained.

Example 9

Example 8 was repeated with the exception that the monomer containing layer was coated on top of the photosensitive element instead of on top of the receiving element. A printing plate with equally good characteristics was obtained.

Example 10

Example 9 was repeated with the exception that the described receiving element was replaced by a mechanically grained and anodized aluminium support having a thickness of 0.15 mm. A printing plate with excellent printing characteristics was obtained.

We claim:

1. Method for the formation of an image consisting essentially of the steps of
   (1) image-wise exposing, in the presence of a photopolymerizable compound, a photosensitive element comprising a support and at least one photosensitive layer containing a silver halide sensitive to actinic radiation, a silver salt oxidizing agent and a reducing agent,
   (2) heating said photosensitive layer while in contact with a receiving element and allowing non-photopolymerized compound in the non-exposed areas to transfer and penetrate in said receiving element, and,
   (3) separating said receiving element from said photosensitive element.

2. Method according to claim 1 wherein said photopolymerizable compound contains one or more polymerizable acrylate or methacrylate groups.

3. Method according to claim 2 wherein said photopolymerizable compound containing one or more polymerizable acrylate or methacrylate groups is a reactive multifunctional monomer represented by general formula (I) or (II):

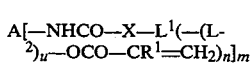

$$A[-NHCO-X-L^1(-L^2)_u-OCO-CR^1=CH_2)_n]_m \quad (I)$$

wherein n represents an integer from 1 to 3, m equals an integer of 3 to 6 when n equals 1, and 2 to 6 when n equals 2 or 3, and u equals 0 or 1; A represents an organic group of the following nature being 3 to 6 valent when n equals 1 and being 2 to 6 valent when n equals 2 or 3:
   a) a hydrocarbon residue containing 5 to 25 carbon atoms which may be interrupted by one or more ether, ester or amide functions;
   b)

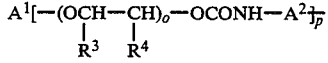

$$A^1[-(OCH-CH)_o-OCONH-A^2]_p$$
$$\phantom{A^1[-(O}R^3\phantom{H-}R^4$$

with $A^1$ representing a linear or branched aliphatic residue that may contain 0 to 3 O-atoms and 2 to 20 C-atoms, an aromatic residue containing 6 to 24 carbon atoms, an aromatic aliphatic residue containing 7 to 28 C-atoms or an cycloaliphatic residue containing 6 to 26 C-atoms, $R^3$ and $R^4$ each independently representing a hydrogen or a methyl group, $A^2$ representing a hydrocarbon residue containing 5 to 25 carbon atoms, o represents an integer of 0 to 5 and p represents an integer of 2 to 6 when n equals 2 or 3 and represents an integer of 3 to 6 when n equals 1;
   c)

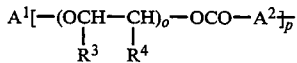

$$A^1[-(OCH-CH)_o-OCO-A^2]_p$$
$$\phantom{A^1[-(O}R^3\phantom{H-}R^4$$

wherein $A^1$, $A^2$, $R^3$, $R^4$, o and p have the same meaning as defined above
   d)

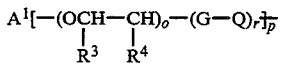

$$A^1[-(OCH-CH)_o-(G-Q)_r]_p$$
$$\phantom{A^1[-(O}R^3\phantom{H-}R^4$$

wherein $A^1$, $A^2$, $R^3$, $R^4$, o and p have the same meaning as defined above
G represents $-O-CO-NH-Y(-COO-)_q-$;
   wherein Y represents a divalent (cyclo)aliphatic residue containing 2 to 15 C-atoms and that may contain an ester, ether or urethane function, and q represents 0 or 1
Q represents a linear or branched aliphatic hydrocarbon residue containing 3 to 15 carbon atoms and which may comprise 1 to 3 oxygen bridges and r equals 0 or 1, X represents O or $NR^2$, $L^1$ represents an aliphatic hydrocarbon residue that is at least divalent and that may comprise 1 to 3 O-atoms, $L^2$ represents a lower alkylene of 1 to 6 C-atoms which may be branched or linear, $R^1$ represents hydrogen or a methyl group, $R^2$ represents hydrogen or a lower alkyl group of 1 to 6 C-atoms;

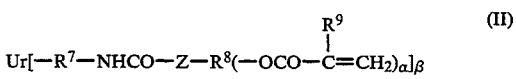

$$Ur[-R^7-NHCO-Z-R^8(-OCO-\overset{R^9}{\underset{|}{C}}=CH_2)_a]_\beta \quad (II)$$

wherein Ur represents a divalent or trivalent condensed urea residue; Z represents O or $NR^{10}$ with $R^{10}$ representing alkyl containing 1 to 12C-atoms; $R^7$ represents a divalent hydrocarbon residue containing 2 to 25 C-atoms; $R^8$ represents a hydrocarbon residue with a valence between 2 and 6, and containing 2 to 18 C-atoms, which can be linear or branched and which can be interrupted by up to 3 O atoms; $R^9$ represents hydrogen or methyl; $\alpha$ represents an integer from 1 to 5, and $\beta$ equals 2 or 3.

4. Method according to claim 1 wherein said photopolymerizable compound is present in said photosensitive layer.

5. Method according to claim 1 wherein said photopolymerizable compound is present in a separate layer coated on top of said photosensitive element.

6. Method according to claim 1 wherein said photopolymerizable compound is present in a separate layer coated on top of said receiving element.

7. Method according to claim 1 wherein said photosensitive element is image-wise exposed before being brought in contact with said receiving element.

8. Method according to claim 1 wherein said photosensitive element is image-wise exposed through its support after being brought in contact with said receiving element.

9. Method according to claim 1 wherein said photosensitive element and said receiving element are brought in contact by lamination.

10. Method according to claim 1 wherein step (3) is followed by a posthardening of at least one of the separated elements by means of a uniform UV exposure or a heating step or both.

11. Method according to claim 1 wherein said reducing agent is a hydrazine compound.

12. Method according to claim 1 wherein said organic silver salt oxidizing agent is silver behenate.

13. Method according to claim 1 wherein said receiving element comprises a support and a layer containing a pigment.

14. Method according to claim 13 wherein said pigment is carbon black.

15. Method according to claim 1 wherein said receiving element comprises a hydrophilic surface.

16. Method according to claim 15 wherein said receiving element comprises a support and a hydrophilic layer.

17. Method according to claim 16 wherein said hydrophilic layer contains polyvinylalcohol, a tetraalkylorthosilicate and titanium oxide.

18. Method according to claim 15 wherein said receiving element is a metal support having a hydrophilic surface.

19. Method according to claim 18 wherein said metal support having a hydrophilic surface is a grained and anodized aluminium support.

* * * * *